(12) United States Patent
Nakagawa et al.

(10) Patent No.: US 9,030,540 B2
(45) Date of Patent: May 12, 2015

(54) SYSTEMS AND METHODS FOR REDUCING GHOSTING IN A THREE-DIMENSIONAL IMAGE SYSTEM

(71) Applicant: Kabushiki Kaisha Toshiba, Tokyo (JP)

(72) Inventors: Hideaki Nakagawa, Houston, TX (US); Monte Ramstad, Cannon Falls, MN (US); Kazuhisa Takahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 13/675,827

(22) Filed: Nov. 13, 2012

(65) Prior Publication Data
US 2014/0132745 A1     May 15, 2014

(51) Int. Cl.
*H04N 13/04*    (2006.01)
*H04N 13/00*    (2006.01)
*H01L 31/18*    (2006.01)

(52) U.S. Cl.
CPC ............ *H01L 31/18* (2013.01); *H04N 13/0431* (2013.01)

(58) Field of Classification Search
CPC .......... H04N 13/0422; H04N 13/0431; H04N 13/0037; H04N 13/0048; H04N 13/0059; H04N 13/0434; H04N 13/429; G02B 27/22; G06T 7/0075; G06T 7/0022; G06T 2207/10012; G06T 19/20

USPC .............. 348/60, 42, 51, 53, 57–59; 382/154; 345/419; 356/12; 438/70; 359/463
IPC .................................. H04N 15/00, 13/00, 13/04
See application file for complete search history.

(56) References Cited

U.S. PATENT DOCUMENTS

| | | | |
|---|---|---|---|
| 8,086,025 B2 | 12/2011 | Ramstad | |
| 8,194,119 B2 | 6/2012 | Ramstad | |
| 8,610,762 B2 * | 12/2013 | Sharp et al. | 348/53 |
| 2008/0297530 A1 | 12/2008 | Ramstad | |
| 2009/0278919 A1 | 11/2009 | Ramstad | |
| 2010/0134524 A1 * | 6/2010 | Hayashi et al. | 345/690 |
| 2011/0063726 A1 | 3/2011 | Ramstad | |
| 2012/0064944 A1 | 3/2012 | Ramstad | |
| 2012/0268506 A1 | 10/2012 | Ramstad | |
| 2012/0280990 A1 | 11/2012 | Ramstad | |

FOREIGN PATENT DOCUMENTS

| | | |
|---|---|---|
| WO | WO2008/091615 | 7/2008 |
| WO | WO2008/091622 | 7/2008 |
| WO | WO2009/038718 | 3/2009 |
| WO | WO2011/031326 | 3/2011 |

* cited by examiner

*Primary Examiner* — Sherrie Hsia
(74) *Attorney, Agent, or Firm* — Baker Botts L.L.P.

(57) ABSTRACT

The present disclosure describes systems and methods for reducing ghosting in a three-dimensional (3-D) image system. According to embodiments of the present disclosure, a 3-D image generation system may comprise a first pixel disposed on a semiconductor element that emits light in a first color spectrum and a second pixel disposed on a semiconductor element that emits light in a second color spectrum. A controller may be coupled to the first pixel and the second pixel. The controller may cause the 3-D image generation system to display a first stereoscopic image using the first color spectrum and a second stereoscopic image using the second color spectrum. A filter may be coupled to at least one of the first pixel and the second pixel, and alter at least one of the first color spectrum and the second color spectrum.

18 Claims, 7 Drawing Sheets

SYSTEMS AND METHODS FOR REDUCING GHOSTING IN A THREE-DIMENSIONAL IMAGE SYSTEM

TECHNICAL FIELD

Embodiments of the disclosure relate generally to three-dimensional image viewing, and more particularly to systems and methods for reducing ghosting in a three-dimensional image system.

BACKGROUND

In recent years, the commercial demand for three-dimensional (3-D) viewing has increased, both in large scale settings, such as movie theatres, and in small-scale settings, such as in home entertainment centers and in healthcare environments. Some typical 3-D viewing systems require the viewer wear a 3-D image viewing apparatus, otherwise known as "3-D glasses," to perceive the 3-D image. These 3-D glasses can be either active or passive, but typically alter the viewer's perception of the projected image to create the 3-D viewing effect. In some implementations, an anaglyphic 3-D system is implemented, where stereoscopic images are displayed with each image being displayed using a different color spectrum. In some anaglyphic 3-D systems, the 3-D glasses attempt to filter the stereoscopic images such that each eye of the viewer receives just one of the stereoscopic images. Unfortunately, the filtering is often imperfect, causing "ghosting" where one eye of the viewer receives both images, degrading the clarity of the 3-D image.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure

DETAILED DESCRIPTION

Illustrative embodiments of the present invention are described in detail below. In the interest of clarity, not all features of an actual implementation are described in this specification. It will of course be appreciated that in the development of any such actual embodiment, numerous implementation specific decisions must be made to achieve the developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of the present disclosure.

Embodiments described herein are directed to systems and methods for reducing ghosting in a 3-D image system. According to embodiments of the present disclosure, a 3-D image generation system may comprise a first pixel that emits light in a first color spectrum and a second pixel that emits light in a second color spectrum. A controller may be coupled to the first pixel and the second pixel. The controller may cause the 3-D image generation system to display a first stereoscopic image using the first color spectrum and a second stereoscopic image using the second color spectrum. A filter may be coupled to at least one of the first pixel and the second pixel, and alter at least one of the first color spectrum and the second color spectrum.

Figure 1:
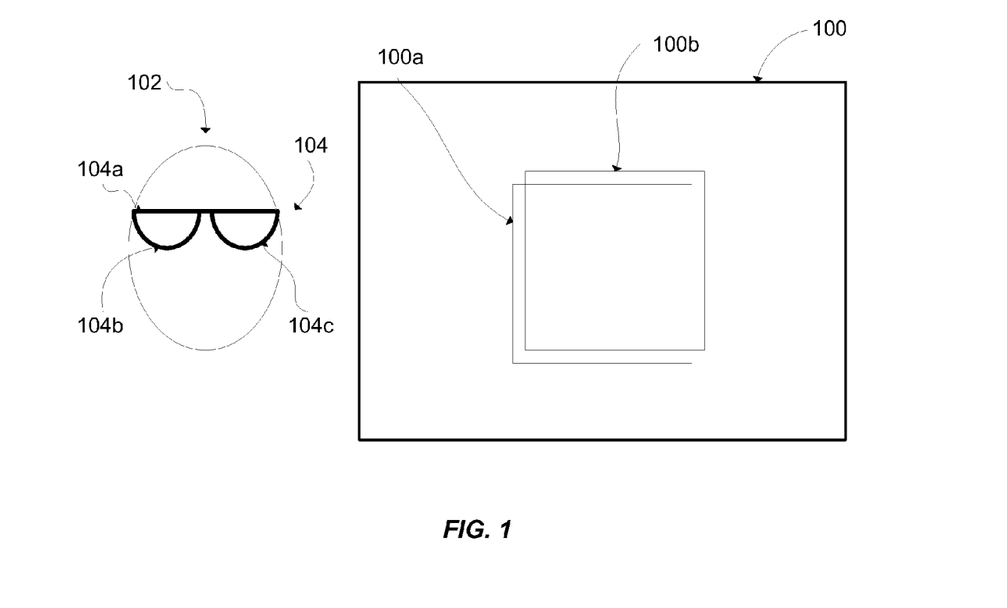
FIG. 1 shows an example 3-D image generation and viewing system, according to aspects of the present disclosure.

FIG. 1 illustrates an example 3-D image generation system, or image source 100, being viewed by an example viewer 102. The 3-D image source 100 may comprise, for example, a 3-D compatible television, a movie screen, a computer monitor, or other image sources well known in the art. In certain embodiments, the image source 100 may comprise a 3-D compatible television incorporating light emitting diode (LED)/liquid crystal display (LCD) elements. The image source 100 may incorporate anaglyphic 3-D technology, displaying a first stereoscopic image 100a in a first color emission spectrum and displaying a second stereoscopic image 100b in a second color emission spectrum. The image source 100 may display the first stereoscopic image 100a in the first color emission spectrum by using a filter, for example, or emitting light from a first set of LEDs that generate light in the first color emission spectrum. Likewise, the image source 100 may display the second stereoscopic image 100b in the second color emission spectrum by using a filter or emitting light from a second set of LEDs that generate light in the second color spectrum.

The user 102 may view the images displayed by image source 100 through 3-D glasses 104. The 3-D glasses may include a frame 104a, a first lens 104b, and a second lens 104c. In certain embodiments, the frame 104a may be made of plastic, metal, cardboard, or other suitable strong material well known in the art. Likewise, the first lens 104b and second lens 104c may be may of plastic, glass, or other materials well known in the art; may take a variety of shapes and sizes; and may be flat, convex, concave, or some combination of the three. As will be described below, the lenses 104b and 104c may be configured to block one of the stereoscopic images and transmit the other stereoscopic image, such that each stereoscopic image is received at a different eye of the viewer, which the user's visual cortex then combines to form a 3-D image.

Figure 2A:
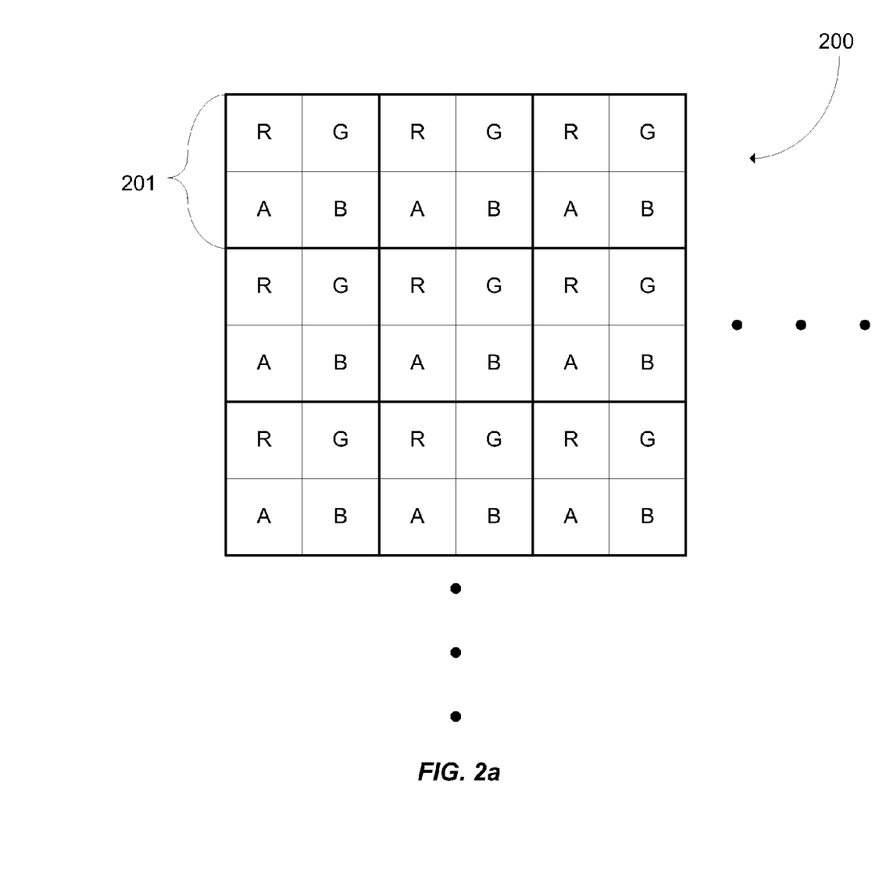
FIG. 2a shows an example image source, according to aspects of the present disclosure.

FIG. 2a illustrates an example image source 200, comprising an array of unit elements with different colored pixels. In FIG. 2, unit element 201 includes an LED which emits light within the amber color spectrum (A), an LED which emits light within the green color spectrum (G), an LED which emits light within the blue color spectrum (B), and an LED which emits light in the red color spectrum (R). The unit element 201 may comprise a semiconductor element, as will be described below, and each of the four color emission spectra R, G, B, and A emitted from the semiconductor elements may be addressed a separate pixels, allowing each color to be emitted separately. Additionally, although a unit element with four color pixels are shown, semiconductor elements with less that four colors are possible. For example, some unit element may include only three colors—red, green, and blue—but with fewer or more than four pixels.

In certain embodiments, as will be describe in greater detail below, the image source 200 may display a first stereoscopic image using light within an amber color spectrum, and may display the second stereoscopic image 100b using light within a red color spectrum, a blue color spectrum, and a green color spectrum. The amber color spectrum may correspond to light with a wavelength between approximately 570 and 590 nanometers (nm). The red color spectrum may correspond to light with a wavelength between approximately 620 and 740 nm. The green color spectrum may correspond to light with a wavelength between approximately 520 to 570 nm. And the blue color spectrum may correspond to light with a wavelength between approximately 450-495 nm. As is well understood by those in the art, the precise limits of each color spectra are inexact. Additionally, the ranges above are for the color spectrum corresponding to each color, but the color actually emitted from the semiconductor element, the color emission spectrum, may be a subset of the wavelengths within the range. For example, the G pixel LED may be configured to emit light within the green spectra primarily at a wavelength of 540 nm.

In certain embodiments, the 3-D glasses may correspond to the image source, meaning the 3-D glasses are configured according to the color emission spectra of the image source. For example, each of the lenses of the 3-D glasses may include filter characteristics that correspond to particular wavelengths of light that the pixels of the image source are configured to emit. If, as described above, the image source 200 displays a first stereoscopic image 100a using an amber color emission spectrum, and displays a second stereoscopic image 100b using a red color emission spectrum, a blue color emission spectrum, and a green color emission spectrum, a first lens may transmit light within amber color emission spectrum, while substantially blocking light within the red, blue, and green color emission spectra. Likewise, the second lens may transmit light within the red, blue, and green color emission spectra, while substantially blocking the amber color emission spectrum. The lens may transmit light by allowing it to pass through the lens to the viewer, and may block the light by absorbing the light within the lens and preventing it from passing through to the viewer. Additionally, substantially blocking a color emission spectrum may include preventing most of or the entire selected color spectrum from being transmitted through the lens; although manufacturing limitations and design choices may make completely blocking a particular color spectrum practically impossible, prohibitively expensive, or otherwise undesirable.

Figure 2B:
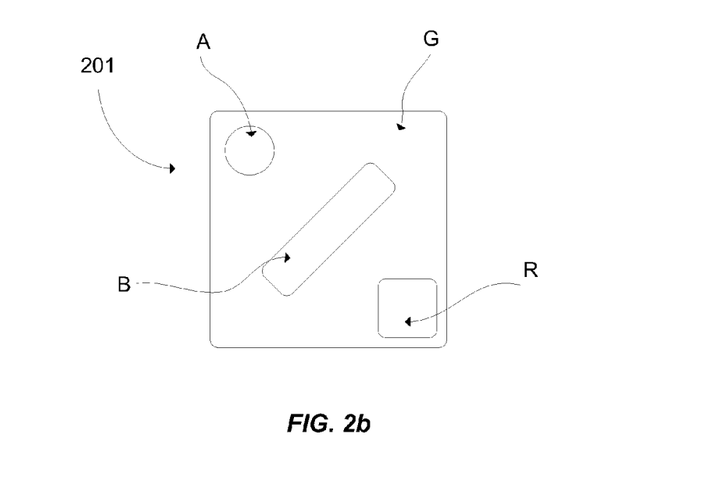
FIG. 2b shows an example unit element, according to aspects of the present disclosure.

FIG. 2b shows an example semiconductor element 201 that may correspond to the unit element 201 shown in FIG. 2a. The semiconductor element may comprise a section (pixel) that emits light within the amber color spectrum (A), a section (pixel) that emits light within the red color spectrum (R), a section (pixel) that emits light within the blue color spectrum (B), and a section (pixel) that emits light within the green color spectrum (G). Each of the sections may be composed of a different semiconductor material, which produces light within the corresponding bandwidth when a voltage is applied. For example, blue light may be emitted from a semiconductor material composed of zinc selenide (ZnSe) or indium gallium nitride (InGaN); red light may be emitted from a semiconductor material composed of aluminum gallium arsenide (AlGaAs), gallium arsenide phosphide (GaAsP), aluminum gallium indium phosphide (AlGaInP), or gallium(III) phosphide (GaP); green light may be emitted from a semiconductor material composed of indium gallium nitride (InGaN), gallium(III) nitride (GaN), gallium(III) phosphide (GaP), aluminum gallium indium phosphide (AlGaInP), or aluminum gallium phosphide (AlGaP); and amber light may be emitted from a semiconductor material composed of gallium arsenide phosphide (GaAsP), aluminum gallium indium phosphide (AlGaInP), or gallium(III) phosphide (GaP). Each of the semiconductor materials may have separate electrical leads, as will be discussed below, such that each may be individually energized, as a pixel, to emit light. The design of the semiconductor element generally would be understood by those of ordinary skill in the art in view of this disclosure.

Figure 7:
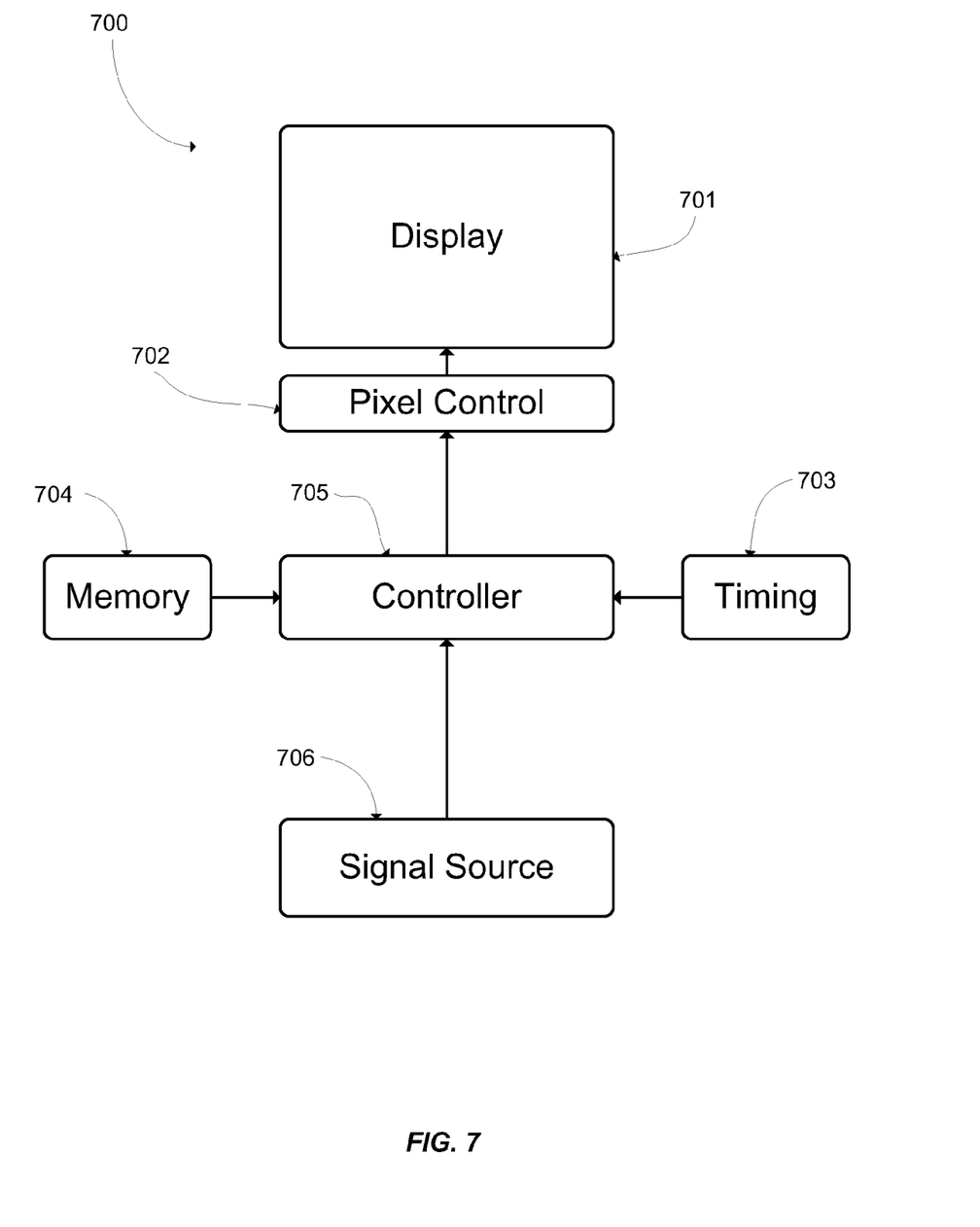
FIG. 7 shows an example image source, according to aspects of the present disclosure.

FIG. 7 illustrates an example 3-D image source 700, according to aspects of the present disclosure. The image source 700 may include a display 702, which includes the arrays of unit elements and pixels, as described above with respect to FIGS. 2a and 2b. The display may be coupled to a pixel controller 702, which received instructions from a controller 705. The controller 705 may comprise any number of microcontrollers or digital signal processors well known in the art. A memory element 704 may be coupled to the controller 705, and the memory element 704 may include a set of instructions that cause the controller 705 to receive input signals from the signal source 706 and a timing device 703, and output control signals to the pixel controller 702. In certain embodiments, the controller 705 may direct the pixel controller 702 to display a first stereoscopic image using a first color emission spectrum and a second stereoscopic image using a second color emission spectrum. The instructions may then be received by the pixel controller 702, which then applies the appropriate voltages to the pixel elements to display the stereoscopic images, as will be described below.

Figure 3:
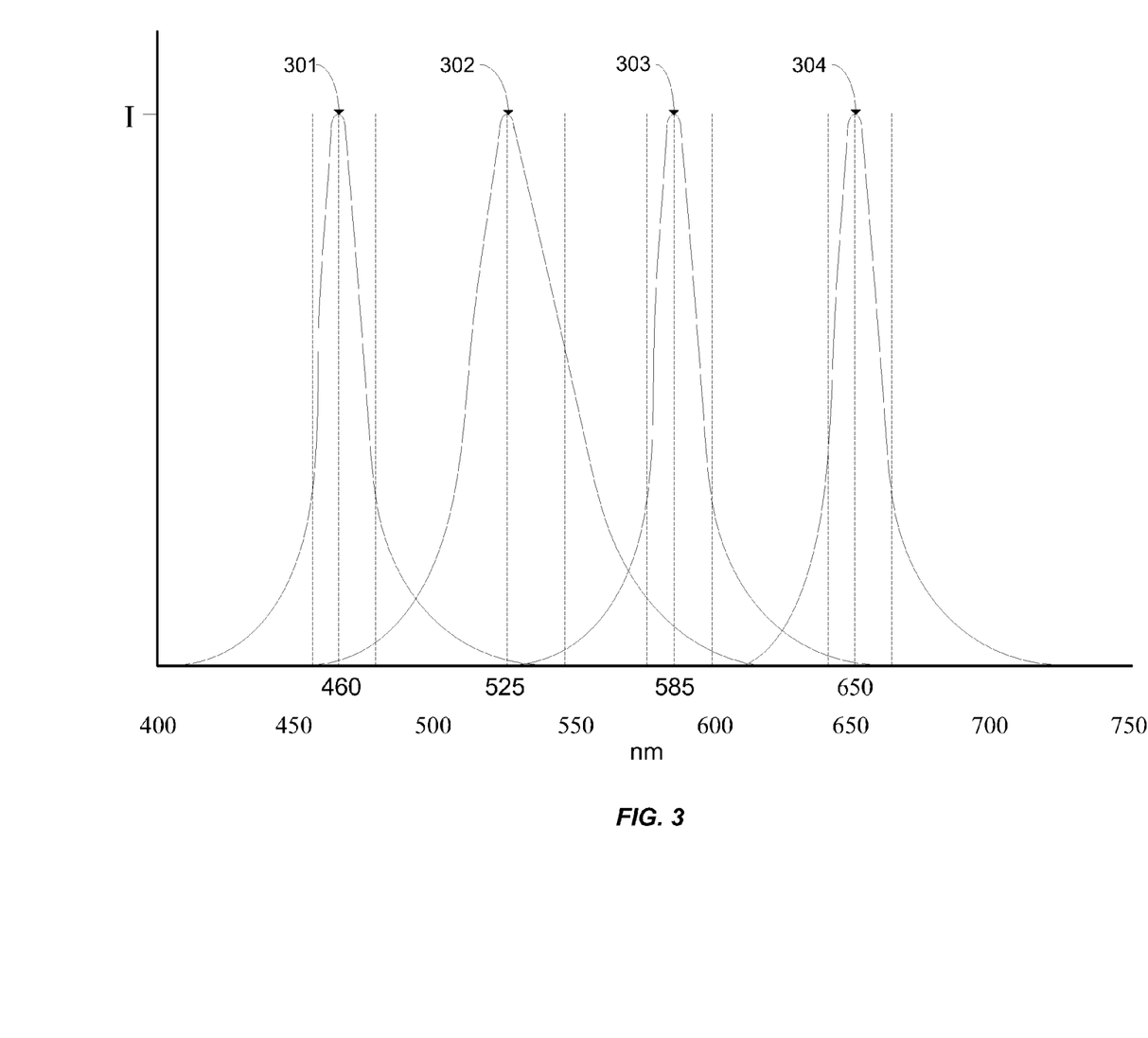
FIG. 3 shows example emission spectra of an image source, according to aspects of the present disclosure.

FIG. 3 illustrates an example plot of the A, R, B, and G emission spectra of the pixels of the semiconductor element 201 from FIGS. 2a and 2b, plotted as the wavelength of the light in nanometers (nm) versus a normalized light intensity I. Emission spectrum 301 corresponds to the B pixel, with the light emitted at its maximum intensity at 460 nm, and with the primary intensity of the emission spectrum 301 being at a wavelength between +/−5 to 10 nm of the 460 nm wavelength. Emission spectrum 302 corresponds to the G pixel, with the light emitted at its maximum intensity at 525 nm, and with the primary intensity of the emission spectrum 302 being at a wavelength between +/−5 to 15 nm of the 525 nm wavelength. Emission spectrum 303 corresponds to the A pixel, with the light emitted at its maximum intensity at 585 nm, and with the primary intensity of the emission spectrum 303 being at a wavelength between +/−5 to 10 nm of the 585 nm wavelength.

Emission spectrum 304 corresponds to the A pixel, with the light emitted at its maximum intensity at 585 nm, and with the primary intensity of the emission spectrum 303 being at a wavelength between +/−5 to 10 nm of the 585 nm wavelength. Other emission spectra are possible, including spectra without one or more of the color elements, as would be appreciated by one of ordinary skill in the art in view of this disclosure.

Figure 4:
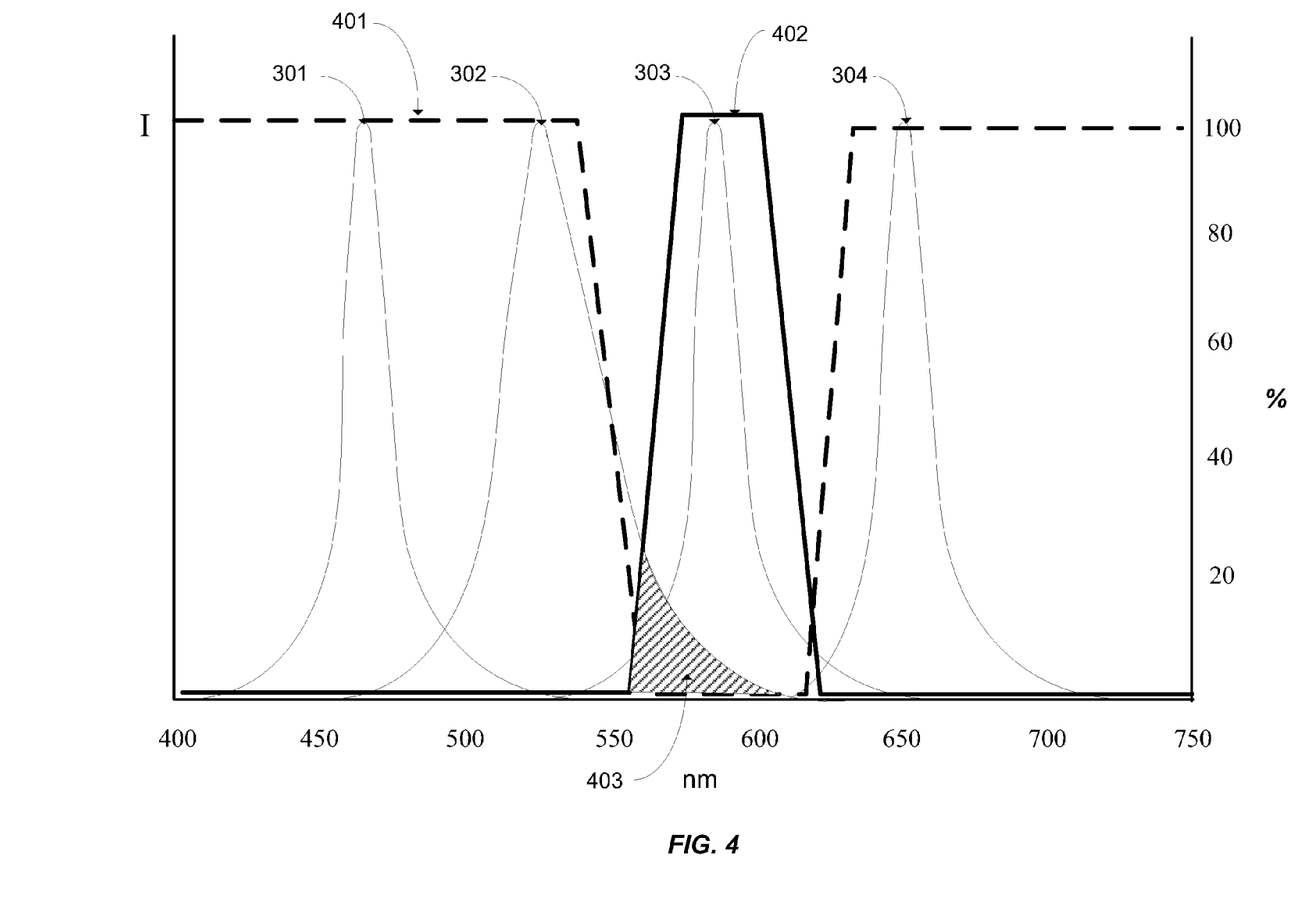
FIG. 4 shows example lens filters for 3-D glasses corresponding to the emission spectra of the image source shown in FIG. 3, according to aspects of the present disclosure.

FIG. 4 illustrates the example plot of FIG. 3, over laid with a plot representing the filter characteristics of example 3-D glasses lenses, plotted in terms of wavelength in nm and the percentage of normalized intensity I of the light which the lens filters allow to be transmitted though the corresponding lens. The combined plot shows how the lens filters interact with the emission spectra discussed above. The first lens filter 401 may comprise a broad base filter, transmitting light within the B pixel emission spectrum 301, the G pixel emission spectrum 302, and the R pixel emission spectrum 304. The first lens filter 401 may also substantially block the light within the A pixel emission spectrum 303 from being transmitted through the first lens. Notably, as discussed above, this allows the image source to display one stereoscopic image using light within the A pixel emission spectrum that is not seen through the first lens.

In contrast to the first lens filter 401, the second lens filter 402 may comprise more of a limited band pass, centered on the A pixel emission spectrum 303. Ideally, the second lens filter 402 may transmit light only within the A pixel emission spectrum 303, while completely blocking the light within the B pixel emission spectrum 301, the G pixel emission spectrum 302, and the R pixel emission spectrum 304 from being transmitted through the second lens. Notably, as discussed above, this would allows the image source to display one stereoscopic image using light within the B, G, and R pixel emission spectra that is not seen through the second lens, and to display another stereoscopic image using light within the A pixel emission spectrum that is not seen in the first lens. The first stereoscopic image (with light from the A pixel emission spectrum) and the second stereoscopic image (with light from the G, B, and R pixel emission spectrum) would then be received separately through different lens, where the viewer's visual cortex forms a three-dimensional image of substantially white light by combining both the stereoscopic images and the color spectra of the images.

Unfortunately, the lens filters are imperfect, and matching the lens filters with the emission spectra of the 3-D image source is difficult. As can be seen, the G pixel emission spectrum 302 has a large side band that overlaps with the A pixel emission spectrum 303, as indicated by the shaded portion 403. The overlap causes some of the G pixel emission spectrum to be transmitted through the second lens filter 402. Because one of the stereoscopic images is transmitted using light from the G pixel emission spectrum, this means that both stereoscopic images displayed by the 3-D image source will be received through the second lens, causing a blurry image or "ghosting" effect, which degrades the 3-D image quality. Although the overlap in FIG. 4 is shown between the G pixel emission spectrum and the A pixel emission spectrum, the overlap may occur in many different configurations using anaglyphic, stereoscopic 3-D image generation and viewing, as would be appreciated by one of ordinary skill in view of this disclosure.

According to aspects of the present disclosure, the "ghosting" effect illustrated in FIG. 4 may be reduced by altering the emission spectra from the 3-D image source. In certain embodiments, the emission spectra of the 3-D image source may be identified, as well as the filter characteristics of the 3-D glasses. The emission spectra of the 3-D image source may then be altered based, at least in part, on the filter characteristics of the 3-D glasses. Identifying the emission spectra of the 3-D image source may include determining the emission spectra of the semiconductor material selected for the various pixels.

In one example embodiment, the emission spectra may be altered by changing the chemical composition of the semiconductor material. For example, with respect to FIG. 4, the semiconductor material used to output the G pixel emission spectrum 302 may be changed such that the G pixel emission spectrum 302 is centered on 510 nm instead of 525 nm. Shifting the G pixel emission spectrum 302 away from the A pixel emission spectrum 303 would reduce the overall ghosting effect. The same technique can be applied to other pixel emission spectra, including pixels with color characteristics different than those shown in FIG. 4.

Figure 5A:
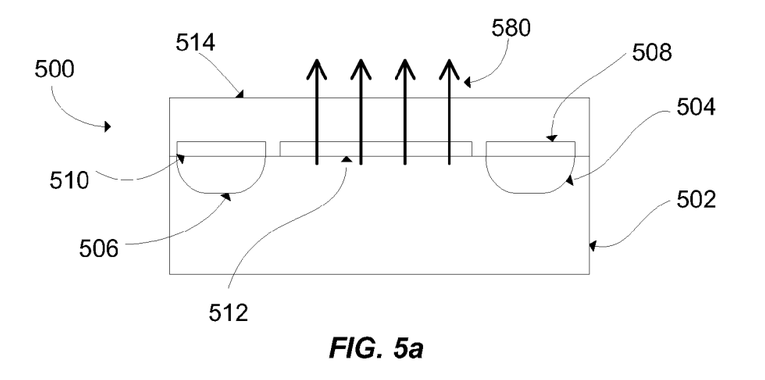
FIGS. 5a-c show example semiconductor filtering techniques, according to aspects of the present disclosure.
Figure 5B:
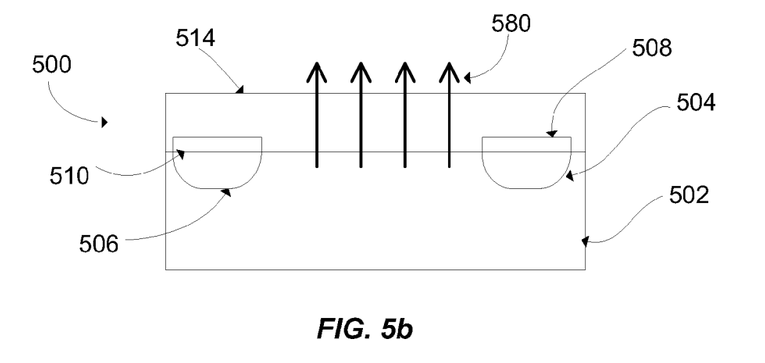
Figure 5C:
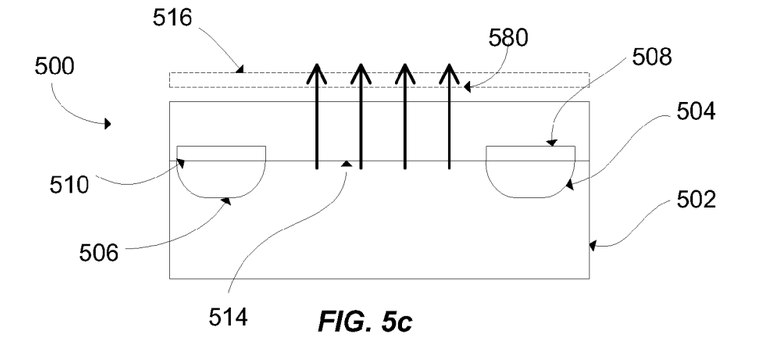

In certain other embodiments, at least one of the color emission spectra may be altered by coupling a filter to the semiconductor element, or to a subset or pixel of the semiconductor element. FIGS. 5a-c illustrate example embodiments for coupling a filter to a semiconductor pixel element. FIGS. 5a-c may include a semiconductor pixel element 500 comprising, for example, a semiconductor material 502. The semiconductor material 502 may be composed of, for example, InGaN such that the semiconductor pixel element 500 emits light within the green spectrum. The semiconductor material 502 may be doped with p-type or n-type materials at locations 504 and 506 to create source and drain nodes. The source and drain nodes 504 and 506 may be coupled with electrodes 508 and 510, respectively, which may be coupled to a power source, and which may cause light to be emitted from the semiconductor material 502 when a voltage differential is applied across the source and drain nodes 504 and 506, as indicated by arrows 580. According to aspects of the present disclosure, a filter 512 may be disposed on the surface of the semiconductor material 502, such that the light emitted from the semiconductor material 502 passes through the filter 512. In certain embodiments, the filter 512 may be deposited on the surface of the semiconductor material 502 as part of a wafer manufacturing technique that would be appreciated by one of ordinary skill in view of the present disclosure.

In certain embodiments, as illustrated in FIG. 5b, the filter may be disposed within an insulative sealing material 514, substantially overlaying the surface of the semiconductor element 500. Instead of a separate filter being deposited on the semiconductor material 502, the insulative sealing material 514 may be chemically modified to alter the emission spectrum of the semiconductor material 502. As can be seen, the light 580 emitted from the semiconductor material 502 passes through the insulative sealing material layer 514, before being transmitted to the viewer. Accordingly, by altering the chemical composition of the insulative sealing material to filter the emitted light, the emission spectrum of the semiconductive material 502 may be altered. In certain other embodiment, instead of modifying the chemical composition of the sealing layer 514, a filter may be layered within the sealing material to alter the emission spectrum of the semiconductor material 502.

In certain embodiments, as illustrated in FIG. 5c, the filter may be disposed within a lens 516 coupled to and disposed around the semiconductor element 500. Instead of the filter being deposited directly onto the semiconductor material 502 or semiconductor element 500, the lens 514 may be modified to alter the emission spectrum of the semiconductor material 502. As can be seen, the light 580 emitted from the semiconductor material 502 passes through the lens 516, before being transmitted to the viewer. Accordingly, by altering the chemical composition of the lens to filter the emitted light, the emission spectrum of the semiconductive material 502 may be altered. In certain other embodiment, instead of modifying the chemical composition of the lens 516, a filter may be layered within the lens 516 to alter the emission spectrum of the semiconductor material 502. The particular chemical composition of the required filters would be appreciated by one of ordinary skill in the art in view of this disclosure.

Figure 6:
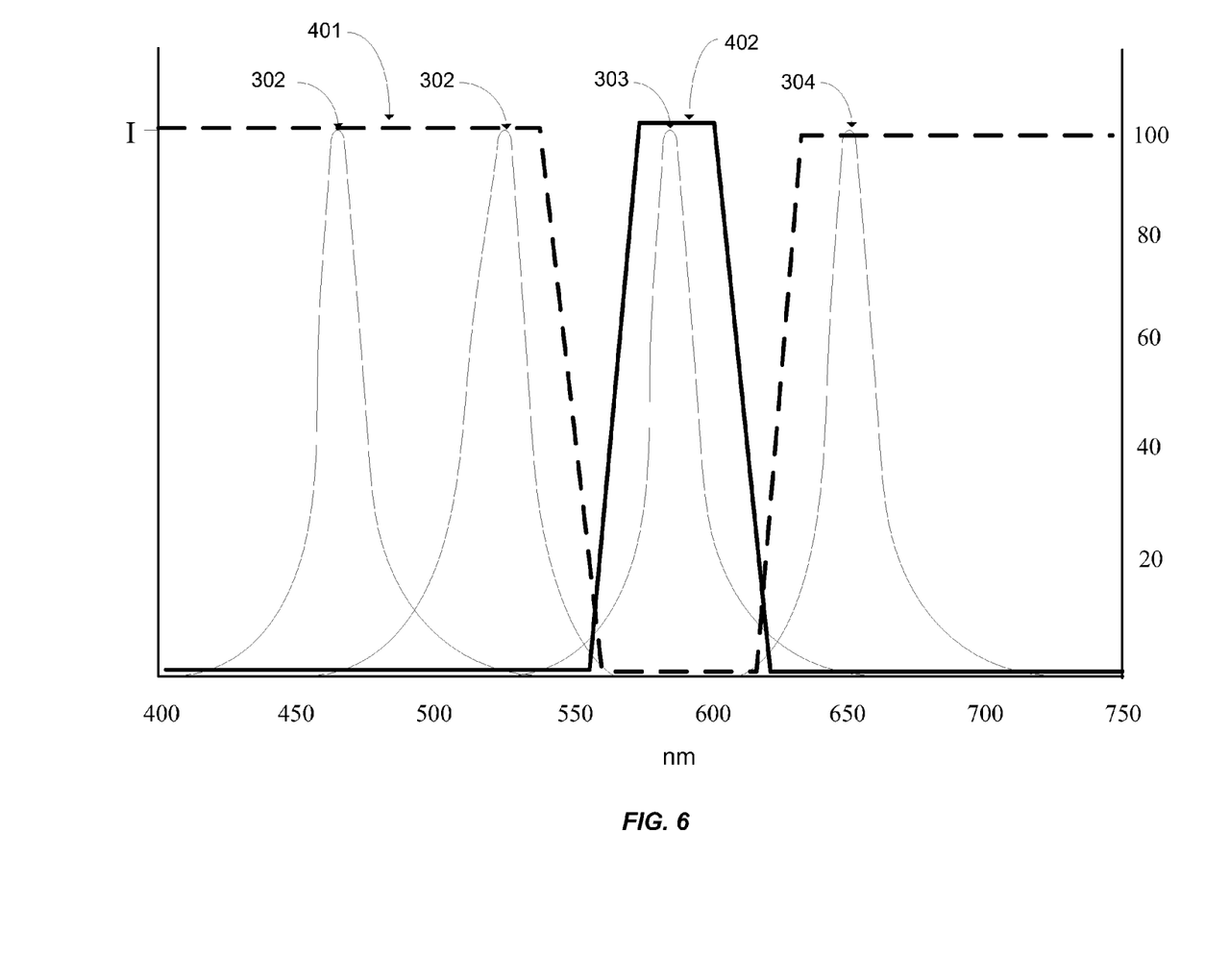
FIG. 6 shows example lens filters for 3-D glasses corresponding to the emission spectra of a filtered image source, according to aspects of the present disclosure.

FIG. 6 illustrates a modified color emission spectrum according to aspects of the present disclosure. In the embodiment shown, the green pixel emission spectrum 302 has been altered, reducing the side band at higher wavelengths, while maintaining the maximum intensity at around 525 nm. As can be seen, by reducing the side band, the green pixel emission spectrum 302 no longer significantly overlaps with the amber pixel emission spectrum 303 and the second lens filter 402. Accordingly, the stereoscopic image transmitted in the green, blue, and red color emission spectra 301, 302, and 304 should not longer be seen within the second lens; and the "ghosting" effect should be reduced.

While certain embodiments of a 3-D image generation system have been described, these embodiments have been presented by way of example only, and are not intended to limit the scope of the disclosure. Indeed, the novel systems described herein may be embodied in a variety of other forms; furthermore, various omissions, substitutions and changes in the form of the systems described herein may be made without departing from the spirit of the disclosure. The accompanying claims and their equivalent are intended to cover such forms or modifications as would fall within the scope and spirit of the disclosure.

What is claimed is:

1. A three-dimensional (3-D) image generation system, comprising:
   a first pixel disposed on a semiconductor element that emits light in a first color emission spectrum;
   a second pixel disposed on a semiconductor element that emits light in a second color emission spectrum;
   a controller coupled to the first pixel and the second pixel, wherein the controller causes the 3-D image generation system to display a first stereoscopic image using the first color emission spectrum and a second stereoscopic image using the second color emission spectrum; and
   a filter coupled to at least one of the first pixel and the second pixel, wherein the filter alters at least one of the first color emission spectrum and the second color emission spectrum.

2. The 3-D image generation system of claim 1, wherein the filter is deposited on a light-emitting semiconductor material of the semiconductor element.

3. The 3-D image generation system of claim 1, wherein the filter is disposed in a lens disposed above the semiconductor element.

4. The 3-D image generation system of claim 1, wherein the filter is disposed in a sealing material deposited on the semiconductor element.

5. The 3-D image generation system of claim 1, wherein the semiconductor element further comprises a third pixel and a fourth pixel,
   the third pixel emits light in a third color emission spectrum and the fourth pixel emits light in a fourth color emission spectrum,
   the first color emission spectrum comprises a green emission spectrum, the second color emission spectrum comprises an amber emission spectrum, the third color spectrum emission spectrum a red emission spectrum, and the fourth color emission spectrum comprises a blue emission spectrum.

6. The 3-D image generation system of claim 5, wherein the first stereoscopic image is further displayed using the third color emission spectrum and the fourth color emission spectrum, and
   the filter alters the green emission spectrum.

7. A three-dimensional (3-D) image generation system, comprising:
   a semiconductor element comprising a first pixel and a second pixel, wherein the first pixel emits light in a first color emission spectrum and the second pixel emits light in a second color emission spectrum;
   a controller coupled to the semiconductor element, wherein the controller causes the 3-D image generation system to display a first stereoscopic image using the first color emission spectrum and a second stereoscopic image using the second color emission spectrum; and
   a filter coupled to the semiconductor element, wherein the filter alters at least one of the first color emission spectrum and the second color emission spectrum based, at least in part, on a filter characteristic of a 3-D image viewing apparatus corresponding to the 3-D image generation system.

8. The 3-D image generation system of claim 7, wherein the filter is deposited on a light-emitting semiconductor material of the semiconductor element.

9. The 3-D image generation system of claim 8, wherein the filter is disposed in a lens disposed above the semiconductor element.

10. The 3-D image generation system of claim 9, wherein the filter is disposed in a sealing material deposited on the semiconductor element.

11. The 3-D image generation system of claim 7, wherein the semiconductor element further comprises a third pixel and a fourth pixel,
    the third pixel emits light in a third color emission spectrum and the fourth pixel emits light in a fourth color emission spectrum,
    the first color emission spectrum comprises a green emission spectrum, the second color emission spectrum comprises an amber emission spectrum, the third color emission spectrum comprises a red emission spectrum, and the fourth color emission spectrum comprises a blue emission spectrum.

12. The 3-D image generation system of claim 11, wherein the first stereoscopic image is further displayed using the third color spectrum and the fourth color spectrum, and
    the filter alters the green emission spectrum.

13. The 3-D image generation system of claim 12, wherein a first lens of the 3-D image viewing apparatus transmits light within the red emission spectrum, the blue emission spectrum, and the green emission spectrum, and wherein a second lens of the 3-D image viewing apparatus transmits light within the amber emission spectrum.

14. A method for manufacturing a three-dimensional (3-D) image generation system, comprising:
    disposing a first pixel on a semiconductor element that emits light in a first color emission spectrum;
    disposing a second pixel on a semiconductor element that emits light in a second color emission spectrum;
    coupling a controller to the first pixel and the second pixel, wherein the controller causes the 3-D image generation system to display a first stereoscopic image using the first color emission spectrum and a second stereoscopic image using the second color emission spectrum; and coupling a filter to at least one of the first pixel and the second pixel, wherein the filter alters at least one of the first color emission spectrum and the second color emission spectrum.

15. The method of claim 14, wherein coupling the filter comprises depositing the filter on a light-emitting semiconductor material of the semiconductor element.

16. The method of claim 14, wherein coupling the filter comprises including the filter in a lens disposed above the semiconductor element.

17. The method of claim 14, wherein coupling the filter comprises including the filter in a sealing material deposited on the semiconductor element.

18. The method of claim 14, wherein the filter alters a green emission spectrum of the 3-D image generation system.

* * * * *